United States Patent
Inazu et al.

(10) Patent No.: US 11,563,139 B2
(45) Date of Patent: Jan. 24, 2023

(54) METHOD OF MANUFACTURING DEEP ULTRAVIOLET LIGHT EMITTING DEVICE

(71) Applicant: Nikkiso Co., Ltd, Tokyo (JP)

(72) Inventors: Tetsuhiko Inazu, Ishikawa (JP); Cyril Pernot, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 215 days.

(21) Appl. No.: 16/811,423

(22) Filed: Mar. 6, 2020

(65) Prior Publication Data

US 2020/0212252 A1 Jul. 2, 2020

Related U.S. Application Data

(60) Division of application No. 16/177,945, filed on Nov. 1, 2018, now abandoned, which is a continuation of application No. PCT/JP2011/014237, filed on Apr. 5, 2017.

(30) Foreign Application Priority Data

May 2, 2016 (JP) .............................. JP2016-092617

(51) Int. Cl.
*H01L 33/00* (2010.01)
*H01L 33/06* (2010.01)
(Continued)

(52) U.S. Cl.
CPC ...... *H01L 33/0025* (2013.01); *H01L 33/0075* (2013.01); *H01L 33/06* (2013.01);
(Continued)

(58) Field of Classification Search
CPC ............... H01L 33/007; H01L 33/0075; H01L 33/0093; H01L 33/22; H01L 2933/0058; H01L 2933/0016
See application file for complete search history.

(56) References Cited

U.S. PATENT DOCUMENTS

2007/0176531 A1 8/2007 Kinoshita
2010/0327312 A1* 12/2010 Uemura .............. H01L 33/0093
257/103
(Continued)

FOREIGN PATENT DOCUMENTS

CN 103730545 A 4/2014
JP 2006245162 A 9/2006
(Continued)

OTHER PUBLICATIONS

Korean Office Action based on corresponding Application No. 10-2018-7031727; dated Oct. 11, 2019.
(Continued)

*Primary Examiner* — Lauren R Bell
(74) *Attorney, Agent, or Firm* — Muncy, Geissler, Olds & Lowe, P.C.

(57) ABSTRACT

A deep ultraviolet light emitting device includes: an electron block layer of a p-type AlGaN-based semiconductor material or a p-type AlN-based semiconductor material provided on a support substrate; an active layer of an AlGaN-based semiconductor material provided on the electron block layer; an n-type clad layer of an n-type AlGaN-based semiconductor material provided on the active layer; an n-type contact layer provided on a partial region of the n-type clad layer and made of an n-type semiconductor material containing gallium nitride (GaN); and an n-side electrode formed on the n-type contact layer. The n-type contact layer has a band gap smaller than that of the n-type clad layer.

4 Claims, 6 Drawing Sheets

(51) Int. Cl.
　　*H01L 33/22*　　(2010.01)
　　*H01L 33/32*　　(2010.01)
　　*H01L 33/38*　　(2010.01)
　　*H01L 33/40*　　(2010.01)

(52) U.S. Cl.
　　CPC .............. *H01L 33/22* (2013.01); *H01L 33/32* (2013.01); *H01L 33/38* (2013.01); *H01L 33/387* (2013.01); *H01L 33/40* (2013.01); *H01L 2933/0016* (2013.01)

(56) References Cited

U.S. PATENT DOCUMENTS

| 2012/0119243 | A1* | 5/2012 | Kim ........................ | H01L 33/38 |
| | | | | 257/98 |
| 2013/0328013 | A1* | 12/2013 | Inazu ...................... | H01L 33/10 |
| | | | | 257/13 |
| 2017/0069793 | A1* | 3/2017 | Saito ........................ | H01L 33/12 |

FOREIGN PATENT DOCUMENTS

| JP | 2008171941 A | 7/2008 |
| JP | 2010507262 A | 3/2010 |
| JP | 5594530 B | 9/2014 |
| WO | WO2006/104063 A1 | 10/2006 |
| WO | WO-2014/123092 A1 | 8/2014 |
| WO | WO2016/004374 A1 | 1/2016 |

OTHER PUBLICATIONS

International Preliminary Report on Patentability based on International Application No. PCT/JP2017/014237; dated Jun. 20, 2018.
International Search Report based on Internation Application No. PCT/JP2017/014237; dated Jun. 6, 2017.
Written Opinion of the International Preliminary Examining Authority based on International Application No. PCT/JP2017/014237; dated Mar. 27, 2018.
Written Opinion of the International Searching Authority based on International Application No. PCT/JP2017/014237; dated Jun. 6, 2017.
Adivarahan et al.; "Vertical Injection Thin Film Deep Ultraviolet Light Emitting Diodes With AIGaN Multiple-Quantum Wells Active Region"; Applied Physics Express 2 (2009); the Japan Society of Applied Physics.
Japanese Office Action dated Dec. 2, 2019 cited in corresponding application No. JP 2016-092617, 4 pages with English translation.
Taiwanese Office Action in application No. 106112671 dated Mar. 23, 2020 and its English Translation; pp. 1-4.

* cited by examiner

METHOD OF MANUFACTURING DEEP ULTRAVIOLET LIGHT EMITTING DEVICE

RELATED APPLICATION

This application is a Divisional of co-pending application Ser. No. 16/177,945, filed on Nov. 1, 2018, which is a continuation of International Patent Application No. PCT/JP2017/014237, filed on Apr. 5, 2017, for which priority is claimed under 35 U.S.C. § 120; and this application claims priority of Application No. 2016-092617 filed in Japan on May 2, 2016 under 35 U.S.C. § 119, the entire contents of all of which are hereby incorporated by reference.

BACKGROUND

1. Field of the Invention

The present invention relates to deep ultraviolet light emitting devices, and, more particularly, to a deep ultraviolet device in which a nitride semiconductor is used and a method of manufacturing such a device.

2. Description of the Related Art

Nowadays, semiconductor light emitting devices such as light emitting diodes and laser diodes that emit blue light have been in practical use. Development of light emitting devices that output light having a shorter wavelength, and, more particularly, deep ultraviolet light has been pursued.

Deep ultraviolet light has sterilization capability. Semiconductor light emitting devices capable of outputting deep ultraviolet light have attracted attention as a mercury-free sterilization light source in medical and food processing fronts. A light emitting device for emitting deep ultraviolet light includes an aluminum gallium nitride (AlGaN) based n-type clad layer, active layer, p-type clad layer, etc. stacked successively on a substrate.

For example, a deep ultraviolet light emitting device is manufactured by forming a p-side electrode in a first region on the p-type clad layer, removing the active layer and the p-type clad layer in a second region different from the first region to expose the n-type clad layer, and forming an n electrode on the n-type clad layer in the second region. The device structure like this is known as so-called "horizontal structure".

There is also proposed a light emitting device of a "vertical structure" in which the substrate is removed from the stack body of the n-type clad layer, the active layer, and the p-type clad layer, and an n-side electrode is formed on the exposed n-type clad layer.

It is said to be easier to realize a high output in the light emitting device of a vertical structure described above than in a horizontal structure in which the n-side electrode and the p-side electrode are adjacent in an in-plane direction. However, according to the non-patent document 1, the series resistance between the n-side electrode and the p-side electrode in the light emitting device of vertical structure is large and an extremely high operating voltage is necessary to drive the device to produce a high output.

SUMMARY

In this background, an illustrative purpose of the present invention is to provide a technology of reducing an operating voltage of a deep ultraviolet light emitting device having a vertical structure.

A deep ultraviolet light emitting device according to an embodiment of the present invention includes: an electron block layer of a p-type AlGaN-based semiconductor material or a p-type AlN-based semiconductor material provided on a support substrate; an active layer of an AlGaN-based semiconductor material provided on the electron block layer; an n-type clad layer of an n-type AlGaN-based semiconductor material provided on the active layer; an n-type contact layer provided on a partial region of the n-type clad layer and made of an n-type semiconductor material containing gallium nitride (GaN); and an n-side electrode formed on the n-type contact layer. The n-type contact layer has a band gap smaller than that of the n-type clad layer.

According to this embodiment, since the n-side electrode is formed via the n-type contact layer having a smaller band gap than the n-type clad layer, the contact resistance of the n-side electrode is lowered. Further, by forming the n-side electrode on the n-type contact layer, it is easier to realize appropriate ohmic contact as compared with the case of forming the n-side electrode on the n-type clad layer of an AlGaN-based semiconductor material. This reduces the series resistance of the light emitting device and realizes a low operating voltage.

A content percentage of aluminum nitride (AlN) of the n-type contact layer may be lower than that of the n-type clad layer.

The n-type clad layer may have a band gap larger than a wavelength of deep ultraviolet light emitted by the active layer. The n-type contact layer may have a band gap smaller than the wavelength of deep ultraviolet light emitted by the active layer.

The n-type clad layer may have a band gap of 4.3 eV or larger.

Another embodiment of the present invention relates to a method of manufacturing a deep ultraviolet light emitting device. The method includes: forming a stack body in which an n-type clad layer of an n-type AlGaN-based semiconductor material, an active layer of an AlGaN-based semiconductor material, and an electron block layer of a p-type AlGaN-based semiconductor material or a p-type AlN-based semiconductor material are stacked on a base substrate successively; removing the base substrate from the stack body; forming an n-type contact layer of an n-type semiconductor material that contains GaN on a partial region on the n-type clad layer exposed by removing the base substrate; and forming an n-side electrode on the n-type contact layer. The n-type contact layer has a band gap smaller than that of the n-type clad layer.

According to this embodiment, since the n-side electrode is formed via the n-type contact layer having a smaller band gap than the n-type clad layer, the contact resistance of the n-side electrode is lowered. Further, by forming the n-side electrode on the n-type contact layer, it is easier to realize proper ohmic contact as compared with the case of forming the n-side electrode on the n-type clad layer of an AlGaN-based semiconductor material. This reduces the series resistance of the light emitting device and reduces an operating voltage.

The forming an n-type contact layer may include: forming a mask, avoiding the partial region on the n-type clad layer exposed by removing the base substrate; forming the layer of an n-type semiconductor material on the mask; and removing the mask to form an opening region on the n-type clad layer.

The forming an n-type contact layer may include: forming the layer of an n-type semiconductor material on the n-type clad layer exposed by removing the base substrate; and removing a portion of the layer of an n-type semiconductor material to form an opening region on the n-type clad layer.

The method may further include: forming a texture structure in an opening region on the n-type contact layer.

The base substrate may be removed from the stack body by a laser lift-off process.

The forming the stack body may include forming a base layer that contains aluminum nitride (AlN) between the base substrate and the n-type clad layer. The removing the base substrate may include removing at least a portion of the base layer to expose the n-type clad layer.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

A description will be given of an embodiment of the present invention with reference to the drawings. Like numerals are used in the description to denote like elements and the description is omitted as appropriate. To facilitate the understanding, the relative dimensions of the constituting elements in the drawings do not necessarily mirror the relative dimensions in the actual apparatus.

Figure 1:
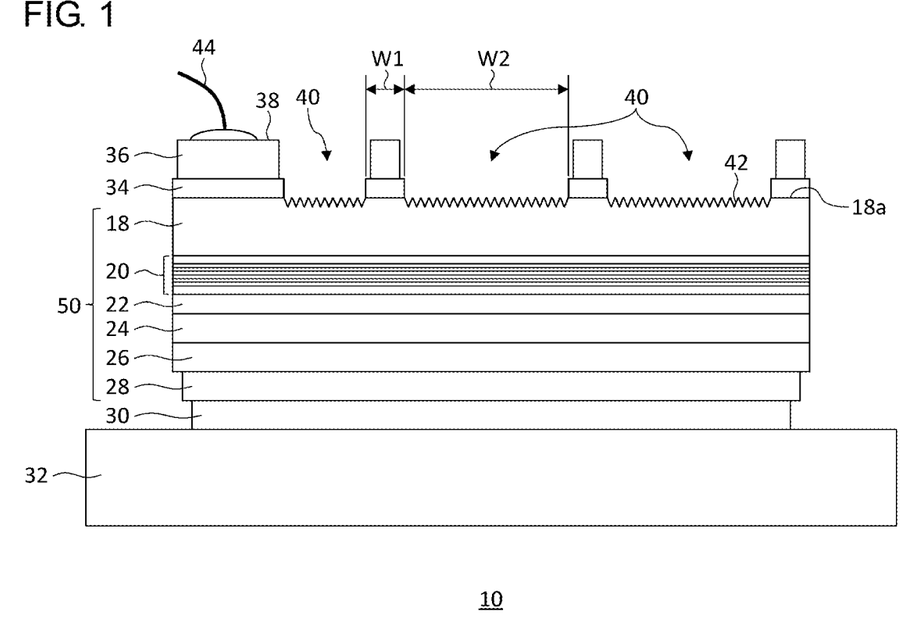
FIG. 1 is a cross sectional view schematically showing a configuration of a deep ultraviolet light emitting device according to the embodiment.

FIG. 1 is a cross sectional view schematically showing a configuration of a deep ultraviolet light emitting device 10 according to the embodiment. The deep ultraviolet light emitting device 10 includes a support substrate 32, an adhesive layer 30, a p-side electrode 28, a p-type contact layer 26, a p-type clad layer 24, an active layer 20, an n-type clad layer 18, an n-type contact layer 34, and an n-side electrode 36. The deep ultraviolet light emitting device 10 is a semiconductor light emitting diode configured to emit "deep ultraviolet light" having a central wavelength A of about 355 nm or lower. To output deep ultraviolet light having such a wavelength, the active layer 20 is made of an aluminum gallium nitride (AlGaN)-based semiconductor material having a band gap of about 3.4 eV or larger. In this embodiment, the case of emitting deep ultraviolet light having a central wavelength A of about 310 nm or shorter is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), and indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN and InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN and InAlN and encompass materials that additionally contain a slight amount of GaN.

The support substrate 32 is a supporting member that mechanically supports a stack body 50 comprised of layers including the p-side electrode 28 through the n-type clad layer 18. The material for the support substrate 32 is not particularly limited, but it is preferable for the support substrate 32 to be made of a material having a high coefficient of thermal conductivity. For example, a ceramic substrate of alumina ($Al_2O_3$), aluminum nitride (AlN), silicon carbide (SiC), etc. may be used. The adhesive layer 30 adhesively bonds the support substrate 32 and the stack body 50. The material for the adhesive layer 30 is not particularly limited, either, but it is preferable for the adhesive layer 30 to be made of a metal material having a high coefficient of thermal conductivity. When metal is used in the adhesive layer 30, the portion of the support substrate 32 in contact with the adhesive layer 30 may be metalized.

The p-side electrode 28 is provided between the adhesive layer 30 and the p-type contact layer 26. The p-side electrode 28 is made of a material capable of establishing ohmic contact with the p-type contact layer 26. For example, the p-side electrode 28 is formed by a nickel (Ni)/gold (Au) stack structure. For example, the thickness of the Ni layer is about 60 nm, and the thickness of the Au layer is about 50 nm.

The p-type contact layer 26 is provided between the p-side electrode 28 and the p-type clad layer 24. The p-type contact layer 26 is made of a p-type AlGaN-based semiconductor material. For example, the p-type contact layer 26 is an AlGaN layer doped with magnesium (Mg) as a p-type impurity. The composition ratio of the p-type contact layer 26 is selected such that the Al content percentage thereof is lower than that of an electron block layer 22 or the p-type clad layer 24. It is preferable that the molar fraction of AlN in the p-type contact layer 26 is 20% or lower, and it is more preferable that the molar fraction of AlN is 10% or lower. The p-type contact layer 26 may be made of a p-type GaN-based semiconductor material that does not substantially contain AlN. By configuring the molar fraction of AlN in the p-type contact layer 26 to be small, proper ohmic contact with the p-side electrode 28 is obtained. The small AlN molar fraction can also reduce the bulk resistance of the p-type contact layer 26 and improve the efficiency of injecting carriers into the active layer 20.

The p-type clad layer 24 is provided between the p-type contact layer 26 and the electron block layer 22. The p-type clad layer 24 is a layer made of a p-type AlGaN-based semiconductor material and is exemplified by a Mg-doped AlGaN layer. The composition ratio of the p-type clad layer 24 is selected such that the molar fraction of AlN in the p-type clad layer 24 is higher than that of the active layer 20 or the p-type contact layer 26 and lower than that of the electron block layer 22. The p-type clad layer 24 has a thickness of about 300 nm-700 nm. For example, the p-type clad layer 24 has a thickness of about 400 nm-600 nm. In one variation the p-type clad layer 24 may not be provided.

The electron block layer 22 is provided between the p-type clad layer 24 and the active layer 20. The electron block layer 22 is a layer made of a p-type AlGaN-based semiconductor material and is exemplified by a Mg-doped AlGaN layer. The composition ratio of the electron block layer 22 is selected such that the molar fraction of AlN in the electron block layer 22 is higher than that of the p-type clad layer 24 and the p-type contact layer 26. For example, the electron block layer 22 is formed such that the molar fraction of AlN is 40% or higher, and, preferably, 50% or higher. The electron block layer 22 may be formed such that the molar fraction of AlN is 80% or higher or may be made of an AlN-based semiconductor material that does not substantially contain GaN. The electron block layer 22 has a thickness of about 1 nm-10 nm. For example, the electron block layer 22 has a thickness of about 2 nm-5 nm.

The active layer 20 is provided between the n-type clad layer 18 and the electron block layer 22. The active layer 20 is made of an AlGaN-based semiconductor material and has a double heterojunction structure by being sandwiched by the n-type clad layer 18 and the electron block layer 22. The active layer 20 may form a monolayer or multilayer quantum well structure. The quantum well structure like this can be formed by building a stack body of a barrier layer made of an n-type AlGaN-based semiconductor material and a well layer made of an undoped AlGaN-based semiconductor material.

The n-type clad layer 18 is provided on the active layer 20. The n-type clad layer 18 is made of a n-type AlGaN-based semiconductor material. For example, the n-type clad layer 18 is an AlGaN layer doped with silicon (Si) as an n-type impurity. The composition ratio of the n-type clad layer 18 is selected to transmit the deep ultraviolet light emitted by the active layer 20. For example, the n-type clad layer 18 is formed such that the molar fraction of AlN is 40% or higher, and, preferably, 50% or higher. The n-type clad layer 18 has a band gap larger than the wavelength of the deep ultraviolet light emitted by the active layer 20. For example, the n-type clad layer 18 is formed to have a band gap of 4.3 eV or larger. It is preferable to form the n-type clad layer 18 such that the molar fraction of AlN is 80% or lower, i.e., the band gap is 5.5 eV or smaller. It is more preferable to form the n-type clad layer 18 such that the molar fraction of AlN is 70% or lower (i.e., the band gap is 5.2 eV or smaller). This is because the electroconductivity of the n-type AlGaN-based semiconductor material drops considerably when the AlN composition ratio exceeds 70%, resulting in an increase in the bulk resistance. The n-type clad layer 18 has a thickness of about 100 nm-300 nm. For example, the n-type clad layer 18 has a thickness of about 200 nm.

The n-type contact layer 34 is provided on a partial region (contact region W1) of the n-type clad layer 18. The n-type contact layer 34 is made of an n-type AlGaN-based semiconductor material. For example, the n-type contact layer 34 is an Si-doped AlGaN layer. The composition ratio of the n-type contact layer 34 is selected such that the Al content percentage thereof is lower than that of the n-type clad layer 18. It is preferable that the molar fraction of AlN in the n-type contact layer 34 is 20% or lower, and it is more preferable that the molar fraction of AlN is 10% or lower. The n-type contact layer 34 may be made of an n-type GaN-based semiconductor material that does not substantially contain AlN. The n-type contact layer 34 may have a band gap smaller than the wavelength of the deep ultraviolet light emitted by the active layer 20. For example, the the band gap may be about 3.4 eV. By configuring the molar fraction of AlN in the n-type contact layer 34 to be small, proper ohmic contact with the n-side electrode 36 is obtained. The small AlN molar fraction can also reduce the bulk resistance of the n-type contact layer 34 and improve the efficiency of injecting carriers into the active layer 20.

The n-side electrode 36 is provided on the n-type contact layer 34. For example, the n-side electrode 36 is formed by a titanium (Ti)/Al/Ti/Au stack structure. For example, the thickness of the first Ti layer is about 20 nm, the thickness of the Al layer is about 100 nm, the thickness of the second Ti layer is about 50 nm, and the thickness of the Au layer is about 100 nm. At least a portion of the n-side electrode 36 functions as a bonding pad 38. A bonding wire 44 is attached to the bonding pad 38.

The contact region W1 and an opening region W2 are provided on a top surface 18a of the n-type clad layer 18. The contact region W1 is a region in which the n-type contact layer 34 and the n-side electrode 36 are formed, and the opening region W2 is a region in which the n-type clad layer 18 is exposed to embody the light emission surface 40. The light emission surface 40 is provided with a texture structure 42 for increasing the efficiency of retrieving light. The texture structure 42 is a micro-asperity structure of a submicron or submillimeter scale.

Figure 2:
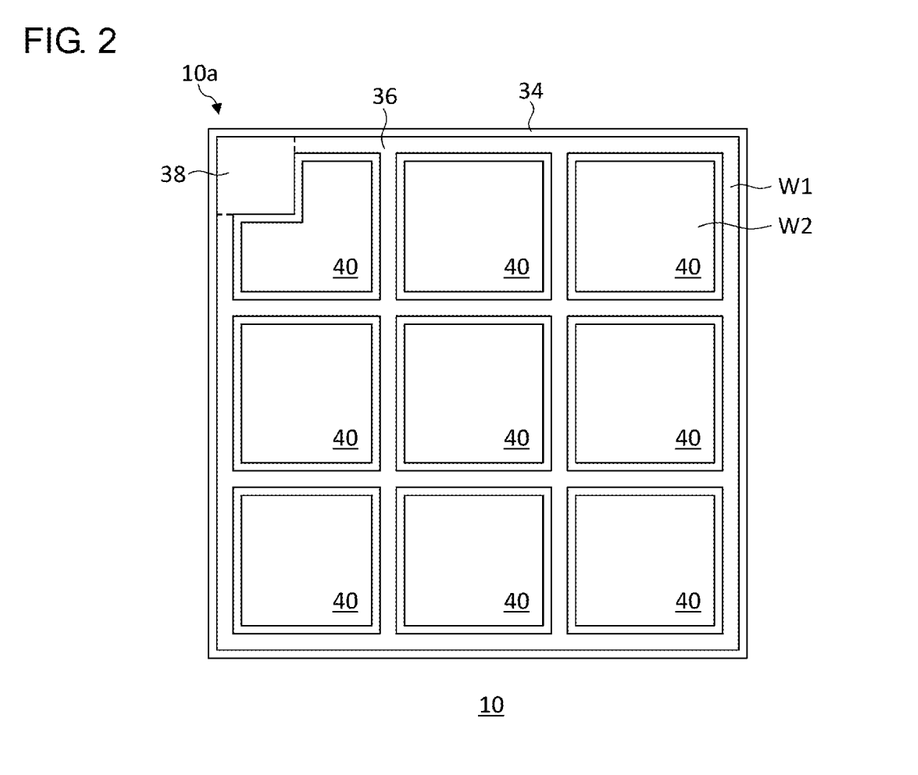
FIG. 2 is a top view schematically showing a configuration of the deep ultraviolet light emitting device of FIG. 1.

FIG. 2 is a top view schematically showing a configuration of the deep ultraviolet light emitting device 10 of FIG. 1 and shows an exemplary configuration of the contact region W1 and the opening region W2. The contact region W1 is a region in which the n-type contact layer 34 is formed and is arranged in a lattice pattern. It is preferable to form the contact region W1 to be wide enough to inject carriers into the active layer 20 and, at the same time, to be narrow enough not to inhibit an output of deep ultraviolet from the light emission surface 40. The contact region W1 is formed in part with a portion more extensive than the other portions to form the bonding pad 38. In the illustrated example, the portion is provided at a corner 10a of the deep ultraviolet light emitting device 10. The opening region W2 is a region corresponding to the light emission surface 40 not formed with the n-type contact layer 34. Each opening region W2 is surrounded by the contact region W1. FIG. 2 shows an example in which nine opening regions W2 are provided. The shapes of the contact region W1 and the opening region W2 are not limited to the illustrated examples. The contact region W1 and the opening region W2 may have other arbitrary shapes.

Figure 3:
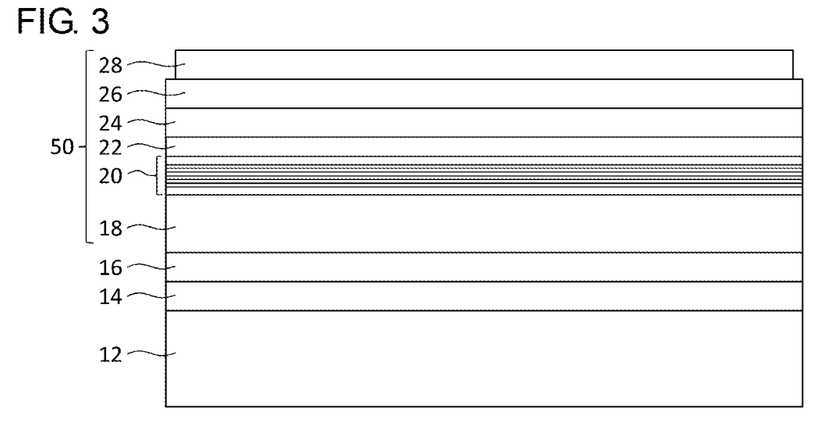
FIG. 3 is a cross sectional view schematically showing a step of manufacturing the deep ultraviolet light emitting device.
Figure 4:
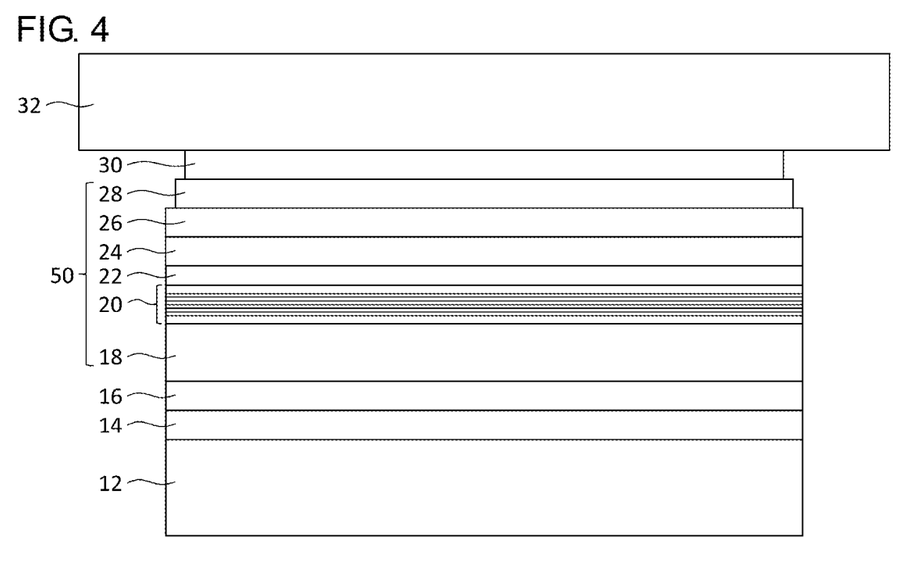
FIG. 4 is a cross sectional view schematically showing a step of manufacturing the deep ultraviolet light emitting device.

A description will now be given of a method of manufacturing the deep ultraviolet light emitting device 10 with reference to FIGS. 3-9. First, as shown in FIG. 3, a first base layer 14, a second base layer 16, the n-type clad layer 18, the active layer 20, the electron block layer 22, the p-type clad layer 24, the p-type contact layer 26, and the p-side electrode 28 are stacked successively on a base substrate 12.

The base substrate 12 is a sapphire ($Al_2O_3$) substrate and is a growth substrate for forming an AlGaN-based semiconductor material. For example, the first base layer 14 and the second base layer 16 are stacked on the (0001) plane of the sapphire substrate. The first base layer 14 is a layer made of an AlN-based semiconductor material and is, for example, an AlN (HT-AlN) layer gown at a high temperature. The second base layer 16 is a layer made of an AlGaN-based semiconductor material and is, for example, an undoped AlGaN (u-AlGaN) layer.

The second base layer 16, the n-type clad layer 18, the active layer 20, the electron block layer 22, the p-type clad layer 24, and the p-type contact layer 26 are layers made of an AlGaN-based semiconductor material or a GaN-based semiconductor material and can be formed by a well-known epitaxial growth method such as the metalorganic chemical vapor deposition (MOVPE) method and the molecular beam epitaxial (MBE) method. The metal layer (Ni/Au layer) forming the p-side electrode 28 may be formed by a well-known method such as the MBE method.

Figure 5:
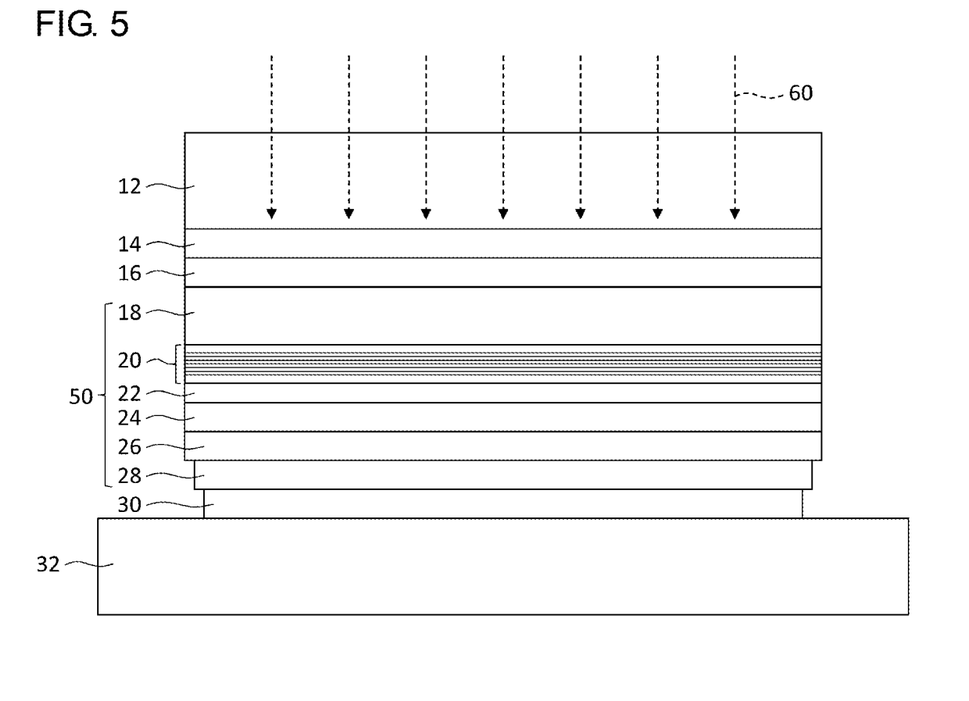
FIG. 5 is a cross sectional view schematically showing a step of manufacturing the deep ultraviolet light emitting device.
Figure 6:
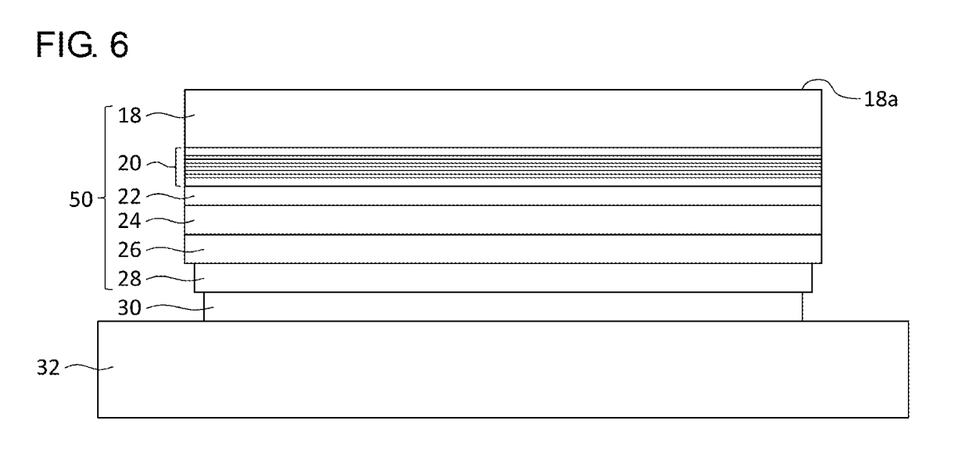
FIG. 6 is a cross sectional view schematically showing a step of manufacturing the deep ultraviolet light emitting device.

Subsequently, the support substrate 32 is attached to the p-side electrode 28 via the adhesive layer 30. Subsequently, as shown in FIG. 5, a laser beam 60 is projected from above the base substrate 12 toward the neighborhood of the interface between the base substrate 12 and the first base layer 14. The base substrate 12 is removed from the stack body 50 in a so-called laser lift-off process. FIG. 5 is oriented upside down relative to FIG. 4 and depicts the support substrate 32 toward the bottom. In a laser lift-off process, only the base substrate 12 may be removed or portions or the entirety of the first base layer 14 and the second base layer 16 may be removed. After the laser lift-off process, at least portions of the first base layer 14 and the second base layer 16 may be removed by reactive ion etching or dry etching using plasma, etc. As shown in FIG. 6, these steps result in the top surface 18a of the n-type clad layer 18 being exposed.

Figure 7:
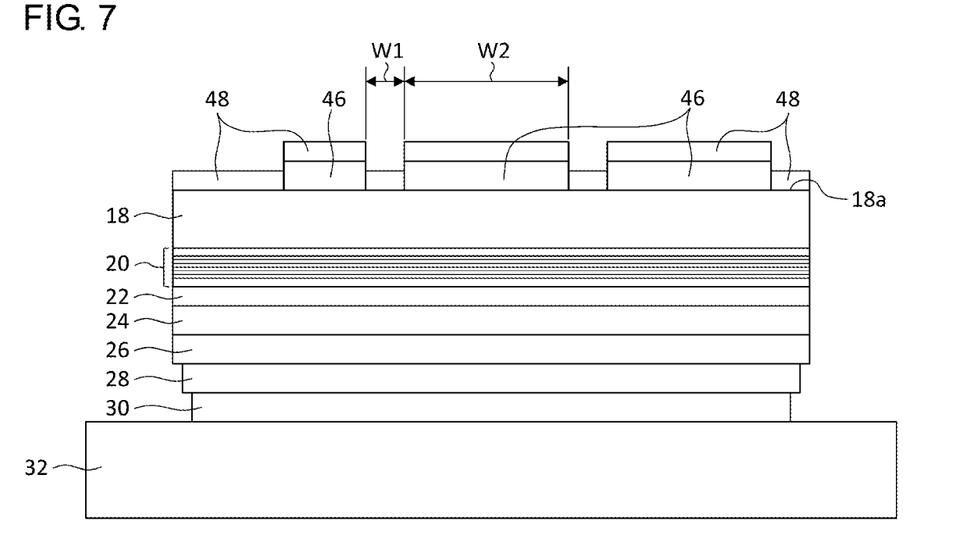
FIG. 7 is a cross sectional view schematically showing a step of manufacturing the deep ultraviolet light emitting device.

Subsequently a mask layer 46 is formed in a portion corresponding to the opening region W2 on the top surface 18a of the n-type clad layer 18. An n-type semiconductor material layer 48 is formed on the mask layer 46. The n-type semiconductor material layer 48 is made of an n-type AlGaN-based semiconductor material. The composition ratio of the n-type semiconductor material layer 48 is selected such that the Al content percentage thereof is lower than that of the n-type clad layer 18. It is preferable that the molar fraction of AlN in the n-type semiconductor material layer 48 is 20% or lower or 10% or lower. The n-type semiconductor material layer 48 may be an n-type GaN-based semiconductor material that does not contain AlN.

Figure 8:
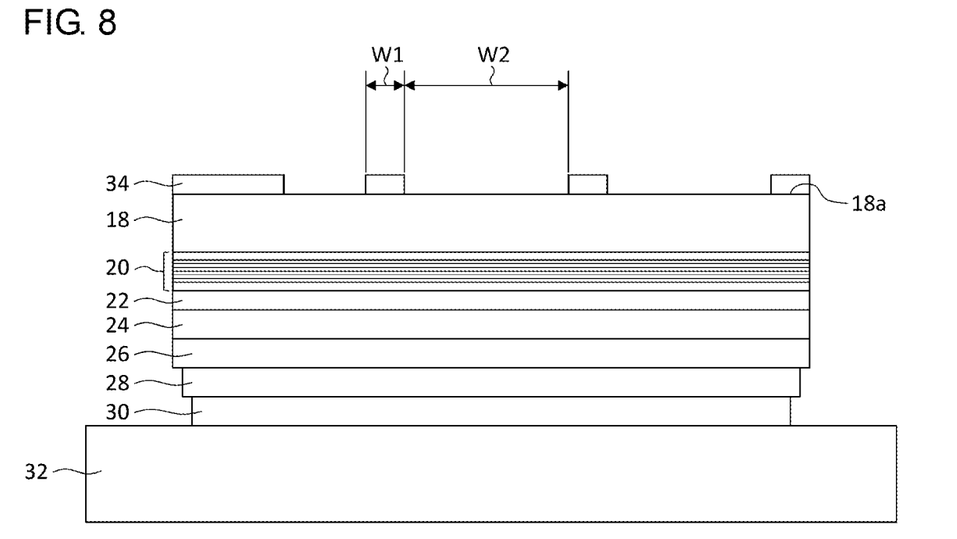
FIG. 8 is a cross sectional view schematically showing a step of manufacturing the deep ultraviolet light emitting device.
Figure 9:
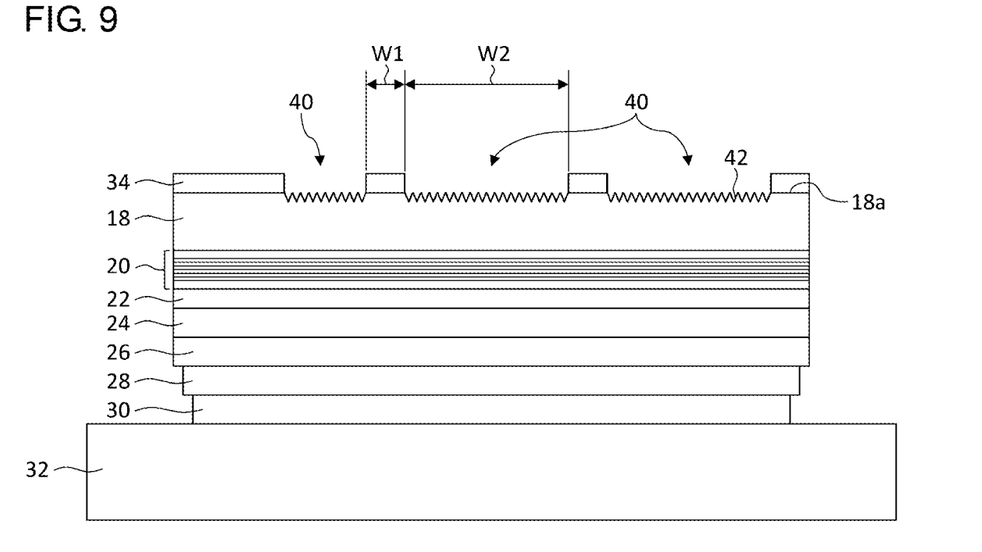
FIG. 9 is a cross sectional view schematically showing a step of manufacturing the deep ultraviolet light emitting device.

Subsequently, the n-type contact layer 34 is completed as shown in FIG. 8 by removing the mask layer 46 and the n-type semiconductor material layer 48 formed on the mask layer 46. The mask layer 46 and the n-type semiconductor material layer 48 formed on the mask layer 46 can be removed by using an acidic solution for dissolving the mask layer 46. Further, the light emission surface 40 is formed as shown in FIG. 9 by forming the texture structure 42 on the surface of the n-type clad layer 18 exposed in the opening region W2. The texture structure 42 can be formed by anisotropically etching the top surface 18a of the n-type clad layer 18 by an alkaline solution such as potassium hydroxide (KOH). Alternatively, the texture structure 42 may be formed by dry etching via a nanoimprinted mask.

Subsequently, the n-side electrode 36 is formed on the n-type contact layer 34. The metal layer (Ti/Al/Ti/Au layer) forming the n-side electrode 36 can be formed by a well-known method such as the MBE method. After the n-side electrode 36 is formed, a thermal process may be performed by using a rapid thermal anneal (RTA) process in order to reduce the contact resistance between the n-type contact layer 34 and the n-side electrode 36. Ultimately, the deep ultraviolet light emitting device 10 shown in FIG. 1 is completed by connecting the bonding wire 44 to the bonding pad 38 formed by a portion of the n-side electrode 36.

A description will now be given of an advantage achieved by the deep ultraviolet light emitting device 10 according to the embodiment. According to the embodiment, a vertical structure in which the p-side electrode 28 and the n-side electrode 36 are arranged vertically, sandwiching the active layer 20, can be realized. Therefore, the light emitting device can produce a higher output as compared to the horizontal structure. Since the n-side electrode 36 is formed via the n-type contact layer 34 instead of forming the n-side electrode 36 immediately above the n-type clad layer 18, proper ohmic contact is obtained. This reduces the series resistance value between the p-side electrode 28 and the n-side electrode 36 of the deep ultraviolet light emitting device 10 and lowers the operating voltage of the deep ultraviolet light emitting device 10.

The n-type clad layer 18 is located between the active layer 20 and the light emission surface 40. It is therefore necessary for the n-type clad layer 18 to be transparent to the wavelength of emitted light and have a band gap larger than the the wavelength of emitted light in order to retrieve the deep ultraviolet light efficiently from the active layer 20 outside. For example, our knowledge shows that the n-type clad layer 18 having a band gap of 4.3 eV or larger needs to be used to retrieve ultraviolet light of a wavelength of 310 nm or smaller efficiently. In order to realize a band gap like this, an AlGaN-based semiconductor material with an AlN-composition ratio of 40% or higher, and, suitably, 50% or higher, may be used. If the AlN composition ratio in the n-type clad layer 18 is increased, however, it will be difficult to obtain proper ohmic contact with the n-side electrode 36, and a thermal process at a high temperature will be indispensable to lower the contact resistance. It is known from the knowledge of the inventor etc. that a thermal process at 900° C. or higher is necessary to obtain ohmic contact with AlGaN with an AlN composition ratio of 40%. A thermal process at such a high temperature performed after the n-side electrode 36 is formed impacts the layers constituting the stack body 50 and the adhesive layer 30 that adhesively bonds the stack body 50 and the support substrate 32, with the result that the performance of the deep ultraviolet light emitting device 10 may be impaired.

According to the embodiment, on the other hand, the n-side electrode 36 is provided via the n-type contact layer 34 having a smaller band gap, i.e., having a smaller AlN composition ratio, than the n-type clad layer 18. It is therefore relatively easier to obtain proper ohmic contact. By ensuring that the AlN composition ratio in the n-type contact layer 34 to be 20% or lower, for example, the contact resistance between the n-type contact layer 34 and the n-side electrode 36 can be lowered by a thermal process at a relatively low temperature (e.g., 600° C. or lower). This can dispel concern about a thermal process at a high temperature. Further, by lowering the AlN composition ratio in the n-type contact layer 34 further and forming the n-type contact layer with a GaN-based semiconductor material that does not substantially contain AlN, proper ohmic contact is obtained without applying a thermal process after the n-side electrode 36 is formed.

In further accordance with the embodiment, reduction in the efficiency of retrieving light caused by reflection at the interface of the light emission surface 40 is inhibited by providing the texture structure 42 in the light emission surface 40 of the n-type clad layer 18. The top surface 18a of the n-type clad layer 18 formed with the texture structure 42 is a principal surface in which crystal growth in the n-type clad layer 18 is started and so is primarily comprised of a nitride (N) surface instead of a gallium (Ga) surface. Characteristically, the N surface is wet etched more easily than the Ga surface. Therefore, the texture structure 42 can be formed relatively easily merely by wet etching the exposed surface of the n-type clad layer 18. In accordance with the embodiment, therefore, the texture structure 42 is formed and the deep ultraviolet light emitting device 10 with a high external retrieval efficiency can be realized by wet etching the surface exposed by a laser lift-off process.

Described above is an explanation based on an exemplary embodiment. The embodiment is intended to be illustrative only and it will be understood by those skilled in the art that various design changes are possible and various modifications are possible and that such modifications are also within the scope of the present invention.

(Variation 1)

Figure 10:
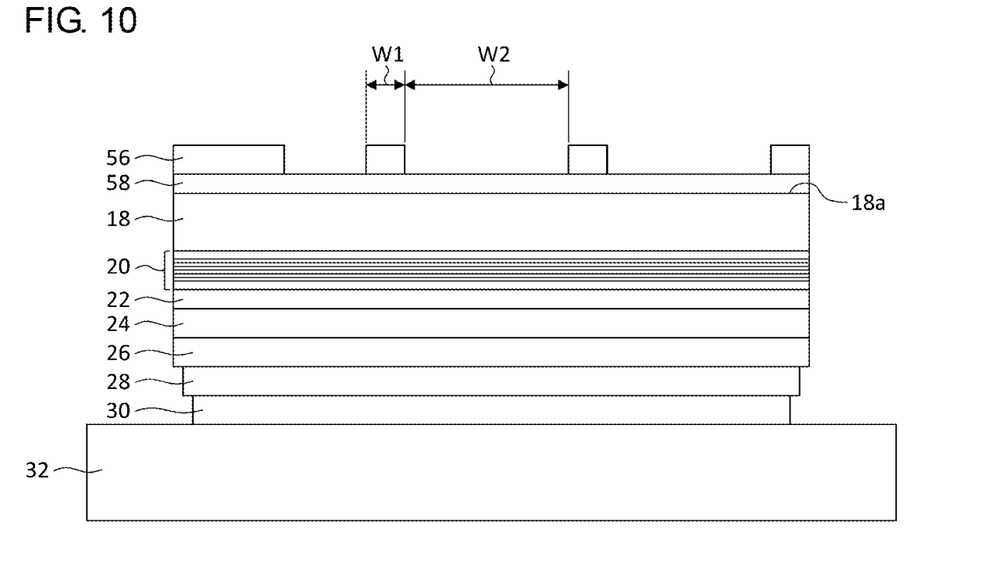
FIG. 10 is a cross sectional view schematically showing a step of manufacturing the deep ultraviolet light emitting device according to a variation.
Figure 11:
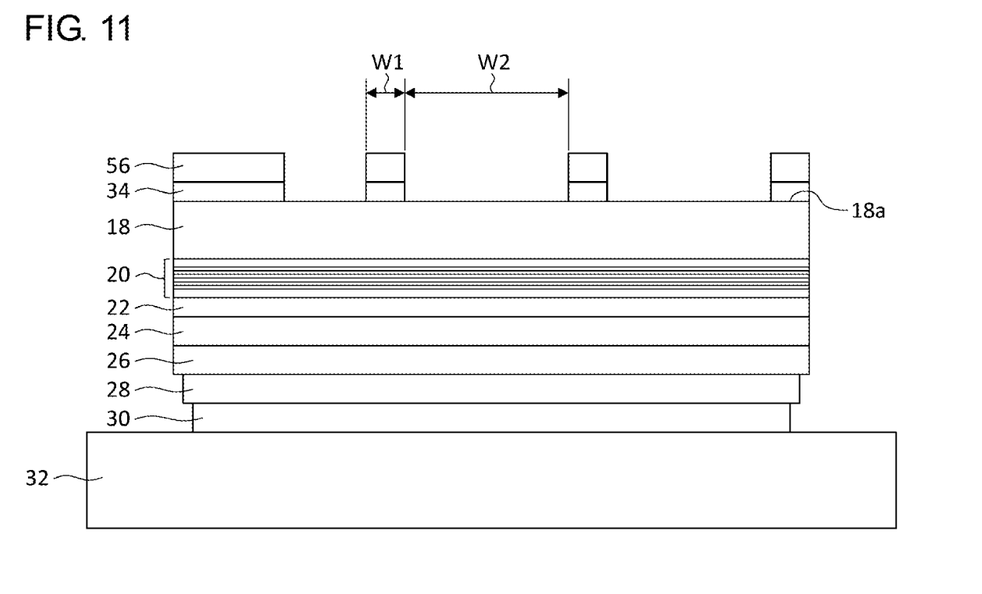
FIG. 11 is a cross sectional view schematically showing a step of manufacturing the deep ultraviolet light emitting device according to a variation.

FIGS. 10 and 11 are cross sectional views schematically showing steps of manufacturing the deep ultraviolet light emitting device 10 according to a variation. The illustrated steps correspond to the steps of FIGS. 7 and 8 described above. This variation differs from the embodiment in that an n-type semiconductor material layer 58 is formed on the top surface 18a of the n-type clad layer 18 before providing a mask layer 56, instead of forming the n-type semiconductor material layer 48 on the mask layer 46.

After the step of FIG. 6, the n-type semiconductor material layer 58 and the mask layer 56 are formed on the top surface 18a of the n-type clad layer 18, as shown in FIG. 10. The n-type semiconductor material layer 58 is formed to cover the entirety of the top surface 18a of the n-type clad layer 18. The mask layer 56 is selectively provided in a portion that embodies the contact region W1 and is provided to expose the n-type semiconductor material layer 58 in the opening region W2.

Subsequently, the n-type contact layer 34 selectively provided in the contact region W1 is formed by removing a portion of the n-type semiconductor material layer 58, i.e., a portion corresponding to the opening region W2, by using the mask layer 56. Subsequently, the deep ultraviolet light emitting device 10 is completed by forming the texture structure 42 in the opening region W2 as in the step of FIG. 9, forming the n-side electrode 36 on the n-type contact layer 34, and connecting the bonding wire 44 to the bonding pad 38.

(Variation 2)

In the embodiment described above, the base substrate 12 is removed by a laser lift-off process and the first base layer 14 and the second base layer 16 that remain on the n-type clad layer 18 are removed to expose the n-type clad layer 18 before forming the n-type contact layer 34. In one variation, the n-type contact layer 34 may be formed on the first base layer 14 or the second base layer 16 exposed by a laser lift-off process. In other words, the n-type contact layer 34 may be formed on the u-AlGan layer or the AlN layer provided on the n-type AlGaN semiconductor material (the n-type clad layer 18). The contact resistance of the n-side electrode 36 is similarly lowered in this case as compared with the case of forming the n-side electrode 36 directly on the u-AlGaN layer or the AlN layer.

(Variation 3)

In the embodiment described above, the stack body 50 including the n-type clad layer 18 is formed on the stack structure of the base substrate 12, the first base layer 14, and the second base layer 16. In one variation, the stack body 50 including the n-type clad layer 18 may be formed on a growth substrate of a different material. For example, the second base layer 16 may be omitted, and the n-type clad layer 18 may be formed on the first base layer 14 that is an AlN layer. Alternatively, an AlN layer may be formed on a growth substrate of a material different from sapphire, and the second base layer 16 plus the n-type clad layer 18, or the n-type clad layer 18 may be formed on the AlN layer.

(Variation 4)

In one variation, a superlattice structure made of a p-type AlGaN semiconductor material may be formed in the p-type clad layer 24. The superlattice structure can be formed by, for example, building a stack body of an AlGaN layer having a relatively larger AlN molar fraction and an AlGaN layer having a smaller AlN molar fraction. More specifically, the superlattice structure can be formed by building a stack of an AlGaN layer having an AlN molar fraction of 60% and an AlGaN layer having an AlN molar fraction of 40%.

The superlattice structure is configured to form a two-dimensional hole gas (2DHG) in which carriers (holes) injected from the p-type contact layer 26 are distributed two-dimensionally and is configured to promote movement of carriers in the horizontal direction. By forming such a superlattice structure, the efficiency of injecting carriers into the active layer 20 is increased and the output of the deep ultraviolet light emitting device 10 is improved.

It should be understood that the invention is not limited to the above-described embodiment but may be modified into various forms on the basis of the spirit of the invention. Additionally, the modifications are included in the scope of the invention.

What is claimed is:

1. A method of manufacturing a deep ultraviolet light emitting device comprising:
    forming a stack body in which an n-type clad layer made of an n-type $In_{1-x1-y1}Al_{x1}Ga_{y1}N$ ($0 \leq x1+y1 \leq 1$, $0 \leq x1 \leq 1$, $0 \leq y1 \leq 1$), an active layer made of $In_{1-x2-y2}Al_{x2}Ga_{y2}N$ ($0 \leq x2+y2 \leq 1$, $0 \leq x2 \leq 1$, $0 \leq y2 \leq 1$), and an electron block layer made of $In_{1-x3-y3}Al_{x3}Ga_{y3}N$ ($0 \leq x3+y3 \leq 1$, $0 \leq x3 \leq 1$, $0 \leq y3 \leq 1$) are stacked on a base substrate successively;
    removing the base substrate from the stack body;
    forming an n-type contact layer made of an n-type semiconductor material that contains GaN on the n-type clad layer exposed by the removing the base substrate;
    forming a mask in a partial region on the n-type contact layer;

removing the n-type contact layer in an opening region not overlapping the mask to expose the n-type clad layer in the opening region;

forming a texture structure in the opening region on the n-type clad layer after removing the n-type contact layer in the opening region; and forming an n-side electrode in the partial region on the n-type contact layer, wherein the n-type contact layer has a band gap smaller than a band gap of the n-type clad layer.

2. The method of manufacturing a deep ultraviolet light emitting device according to claim 1, wherein the base substrate is removed from the stack body by a laser lift-off process.

3. The method of manufacturing a deep ultraviolet light emitting device according to claim 1, wherein the forming the stack body includes forming a base layer that contains aluminum nitride (AlN) between the base substrate and the n-type clad layer, and the removing the base substrate includes removing at least a portion of the base layer to expose the n-type clad layer.

4. The method of manufacturing a deep ultraviolet light emitting device according to claim 1, wherein the forming the stack body comprises forming a p-type contact layer made of a p-type $In_{1-x4-y4}Al_{x4}Ga_{y4}N$ ($0 \leq x4+y4 \leq 1$, $0 \leq x4 \leq 1$, $0 \leq y4 \leq 1$) on the active layer and forming a p-side electrode on the p-type contact layer.

* * * * *

UNITED STATES PATENT AND TRADEMARK OFFICE
CERTIFICATE OF CORRECTION

| | | |
|---|---|---|
| PATENT NO. | : 11,563,139 B2 | Page 1 of 1 |
| APPLICATION NO. | : 16/811423 | |
| DATED | : January 24, 2023 | |
| INVENTOR(S) | : Tetsuhiko Inazu and Cyril Pernot | |

It is certified that error appears in the above-identified patent and that said Letters Patent is hereby corrected as shown below:

On the Title Page

Item (60) Line 3 International application number, --PCT/JP2011/014237-- should be --PCT/JP2017/014237--

Signed and Sealed this
Seventeenth Day of October, 2023

Katherine Kelly Vidal
*Director of the United States Patent and Trademark Office*